(12) United States Patent
Yamada et al.

(10) Patent No.: US 9,451,720 B2
(45) Date of Patent: Sep. 20, 2016

(54) ELECTRONIC DEVICE (71) Applicant: Kabushiki Kaisha Toshiba, Tokyo (JP)

(72) Inventors: Takiharu Yamada, Tokyo (JP);
Tsutomu Sato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 482 days.

(21) Appl. No.: 14/013,942

(22) Filed: Aug. 29, 2013

(65) Prior Publication Data
US 2014/0177184 A1  Jun. 26, 2014

Related U.S. Application Data (63) Continuation of application No. PCT/JP2013/058413, filed on Mar. 22, 2013.

(30) Foreign Application Priority Data

Dec. 26, 2012  (JP) ................. 2012-283117

(51) Int. Cl.
*H05K 7/14* (2006.01)
*G06F 1/20* (2006.01)
(Continued)

(52) U.S. Cl.
CPC ............ *H05K 7/1417* (2013.01); *G06F 1/203* (2013.01); *H01L 23/4006* (2013.01); *H01L 23/427* (2013.01); *H01L 2023/4062* (2013.01);
(Continued)

(58) Field of Classification Search
CPC .................. H05K 7/1417; H05K 2201/10598
USPC ............................................ 361/679.01, 760
See application file for complete search history.

(56) References Cited

U.S. PATENT DOCUMENTS 5,008,777 A * 4/1991 Burns .................... H05K 1/141
                                                             174/138 G
6,741,480 B2 * 5/2004 Hartke ...................... G06F 1/18
                                                             257/E23.088
(Continued)

FOREIGN PATENT DOCUMENTS

DE      102007062359 A1 *  6/2009  ............. H05K 3/301
JP             4-186752          7/1992
(Continued)

OTHER PUBLICATIONS

International Search Report from corresponding PCT/JP2013/058413 application mailed Jun. 4, 2013.

*Primary Examiner* — David Warren
(74) *Attorney, Agent, or Firm* — Rutan & Tucker, LLP; William W. Schaal (57) ABSTRACT

According to one embodiment, electronic device includes casing, circuit board, joint component, and bonding agent. The circuit board is held in the casing, includes first face and second face opposite the first face, and includes a first opening provided on the first face. The joint component includes: insertion portion that is inserted into the first opening; protruding portion that protrudes from the insertion portion toward a side opposite the second face; first end of the protruding portion provided at a side opposite the second face; and support portion extended along the first face. The joint component includes a second opening provided on the first end, extended to the insertion portion, and into which a joint tool is inserted. The bonding agent is provided between the insertion portion and the first opening and between the support portion and the first face, and bonds the circuit board and the joint component.

6 Claims, 8 Drawing Sheets

(51) Int. Cl.
*H01L 23/40* (2006.01)
*H01L 23/427* (2006.01)
*H05K 1/02* (2006.01)

(52) U.S. Cl.
CPC ......... *H01L2924/0002* (2013.01); *H05K 1/02* (2013.01); *H05K 2201/09063* (2013.01); *H05K 2201/10598* (2013.01)

(56) References Cited

U.S. PATENT DOCUMENTS

| | | | | |
|---|---|---|---|---|
| 8,493,737 | B2* | 7/2013 | Abe | H01L 23/427 165/104.33 |
| 2001/0032738 | A1* | 10/2001 | Dibene, II | G06F 1/18 174/260 |
| 2002/0016092 | A1* | 2/2002 | Dibene, II | G06F 1/18 439/74 |
| 2002/0057556 | A1* | 5/2002 | Mizusaki | H05K 1/0271 361/752 |
| 2002/0172022 | A1* | 11/2002 | DiBene, II | G06F 1/18 361/761 |
| 2002/0176229 | A1* | 11/2002 | Derian | G06F 1/18 361/704 |
| 2003/0156400 | A1* | 8/2003 | Dibene, II | G06F 1/18 361/803 |
| 2006/0019510 | A1* | 1/2006 | Rudduck | F16B 1/0014 439/74 |
| 2006/0040529 | A1* | 2/2006 | Kuo | H01R 4/64 439/82 |
| 2006/0046532 | A1* | 3/2006 | Hjort | H05K 1/144 439/74 |
| 2008/0192446 | A1* | 8/2008 | Hankofer | H05K 3/301 361/752 |
| 2010/0226102 | A1 | 9/2010 | So et al. | |
| 2011/0170258 | A1* | 7/2011 | Single | B25F 5/008 361/688 |
| 2012/0270421 | A1* | 10/2012 | Sun | H05K 3/361 439/66 |
| 2012/0302073 | A1* | 11/2012 | Tseng | H01R 12/714 439/65 |
| 2014/0262449 | A1* | 9/2014 | Gektin | H01L 23/4006 174/252 |
| 2015/0147910 | A1* | 5/2015 | Johnescu | H01R 12/7047 439/574 |
| 2015/0216070 | A1* | 7/2015 | Nuriya | B32B 37/0076 361/752 |
| 2015/0245504 | A1* | 8/2015 | Zhang | G02F 1/1333 361/752 |
| 2015/0274138 | A1* | 10/2015 | Heise | B60T 8/368 361/752 |

FOREIGN PATENT DOCUMENTS

| | | |
|---|---|---|
| JP | 2007-012951 | 1/2007 |
| JP | 2008-294234 | 12/2008 |
| JP | 2010-205919 | 9/2010 |
| JP | 2011-077337 | 4/2011 |

\* cited by examiner

ELECTRONIC DEVICE

CROSS-REFERENCE TO RELATED APPLICATIONS

This application is a continuation of International Application No. PCT/JP2013/058413, filed Mar. 22, 2013 which claims the benefit of priority of the prior Japanese Patent Application No. 2012-283117, filed Dec. 26, 2012, the entire contents of which are incorporated herein by reference.

FIELD

Embodiments described herein relate generally to an electronic device.

BACKGROUND

Conventionally, there is known an electronic device in which a joint component that joins a screw is fixed to a circuit board.

In such a kind of electronic device, as an example, it is desired in some cases a configuration with less inconvenience, such as a configuration that can be downsized.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, an electronic device comprises a casing, a circuit board, a joint component, and a bonding agent. The circuit board is held in the casing, comprises a first face and a second face opposite the first face, and comprises a first opening provided on the first face. The joint component comprises: an insertion portion configured to be inserted into the first opening; a protruding portion configured to protrude from the insertion portion toward a side opposite the second face; a first end of the protruding portion provided at a side opposite the second face; and a support portion extended along the first face. The joint component comprises a second opening provided on the first end, extended to the insertion portion, and into which a joint tool is inserted. The bonding agent is provided between the insertion portion and the first opening and between the support portion and the first face, and configured to bond the circuit board and the joint component with each other.

The exemplary embodiment and modifications below comprise similar elements. Those similar elements will be therefore denoted by common reference numerals, and a redundant description will be omitted. Parts included in each embodiment and modification may be constituted with being replaced with corresponding parts of other embodiments and modifications.

Although the following embodiment exemplifies a case in which an electronic device is configured as a clamshell type (notebook type or folding type) personal computer, the electronic device according to the present embodiment is not limited thereto. The electronic device according to the present embodiment may be configured as an electronic device having a circuit board in which a joint component is fixed within a casing such as a tablet type (slate type) or desktop type personal computer, a smartphone, an electronic book terminal, a smart book, a cellular phone, a personal digital assistant (PDA), a video display device, a television receiver, a video display controller, and an information storage device.

Embodiment

Figure 1:
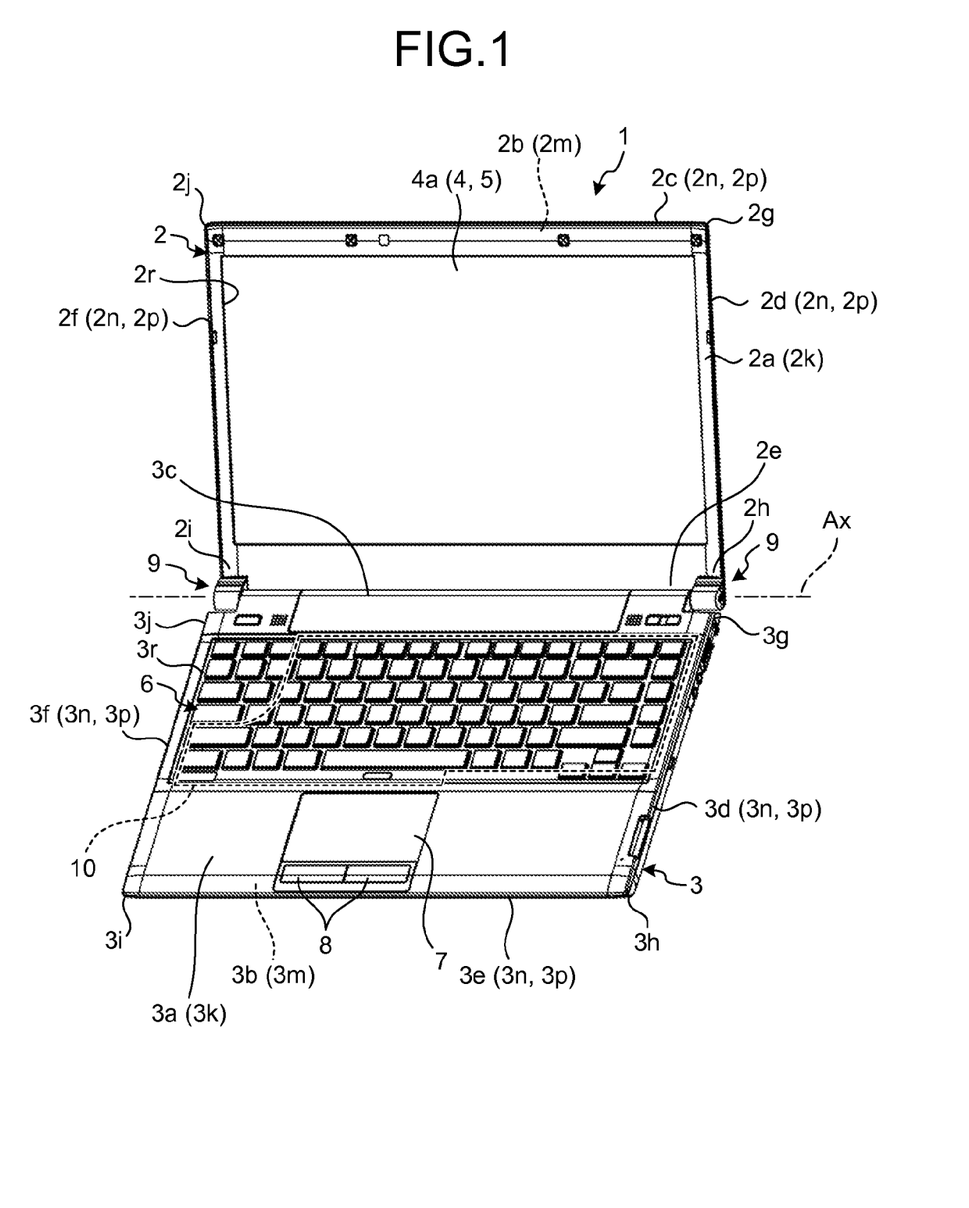
FIG. 1 is an exemplary perspective view of one example of an electronic device according to an embodiment.

In the present embodiment, as an example, as illustrated in FIG. 1, this electronic device 1 comprises a casing 2 (a first casing, casing, or first part) and a casing 3 (a second casing, another casing, or second part). At least portion of a display device 4 is housed in the casing 2. A circuit board 10 is housed in the casing 3. Provided on the casing 3 are a keyboard 6 (an input operating module, input receiver, or input module), a touch pad 7 (an input operating module, input receiver, or input module), a click button 8 (an input operating module, input receiver, or input module), or the like.

The casing 2 and the casing 3 are pivotally connected by hinges 9 (connectors, connecting portions, pivotally supporting portions, hinge mechanisms, connector mechanisms, coupling mechanisms, or pivotally supporting mechanisms). Through the hinges 9, the casing 2 and the casing 3 are pivotally connected between an opened state illustrated at least in FIG. 1 and a folded state (not illustrated). In the present embodiment, as an example, the hinges 9 connect the casing 2 and the casing 3 pivotally about a pivot axis Ax. A display screen 4a of the display device 4 can be viewed through an opening 2r provided on a face 2a (a front, surface, or surface part) of the casing 2. The keyboard 6, the touch pad 7, the click button 8, and the like are exposed on a face 3a (an upper surface, front, first surface, or first surface part) of the casing 3. In the folded state, the face 3a of the casing 3 and the face 2a of the casing 2 overlap each other, so that the display screen 4a and the keyboard 6, the touch pad 7, the click button 8, and the like are covered with the casing 3 and the casing 2. In the developed state, the face 3a of the casing 3 and the face 2a of the casing 2 are exposed, so that the display screen 4a and the keyboard 6, the touch pad 7, the click button 8, and the like become available (become viewable or become operable).

In the present embodiment, as an example, as illustrated in FIG. 1, the casing 2 has a quadrangular (in the present embodiment, as an example, wide rectangular) appearance in the front view and the back view. The casing 2 is, in the present embodiment, as an example, formed in a flat rectangular parallelepipedal shape that is thin in the longitudinal direction (the thickness direction of the casing 2). The casing 2 comprises the face 2a (a front, front face, or face portion), a face 2b (a back face, rear face, or face portion) opposite the face 2a, and a face 2p (a side face or face portion) across the face 2a and the face 2b. Both the face 2a and the face 2b cross the thickness direction. The face 2a and the face 2b are nearly parallel to each other. The faces 2a and 2b and the face 2p cross each other (in the present embodiment, as an example, they are orthogonal to each other). The casing 2 comprises, in the plan view, four ends 2c to 2f (sides, edges, or peripheral portions) and four corners 2g to 2j (pointed portions, bent portions, or ends). The ends 2c and 2e are examples of long sides, whereas ends 2d and 2f are examples of short sides.

The casing 2 comprises a wall 2k (a part, plate, front wall, surface wall, top wall, or first wall), a wall 2m (a part, plate, rear wall, back wall, bottom wall, or second wall), and a wall 2n (a part, plate, side wall, end wall, upright wall, crossing part, or third wall). The wall 2k comprises the face 2a. The wall 2m comprises the face 2b. The wall 2n comprises the face 2p. The walls 2k, 2m, and 2n are all formed in a quadrangular shape (in the present embodiment, as an example, a rectangular shape). The walls 2k, 2m, and 2n are all formed in a plate shape. The wall 2k has a quadrangular opening 2r. The casing 2 can be formed of, for example, a metallic material or a synthetic resin material. The metallic material can be formed by, for example, forging, press, or cutting. The synthetic resin material can be formed by, for example, injection molding. The casing 2 can comprise a plurality of members (components or split bodies).

In the present embodiment, as an example, the display device 4 (a display module, display, panel, or display component) is housed in the casing 2. Specifically, a user can view the display screen 4a of the display device 4 from the front side through the opening 2r. The display device 4 has a quadrangular (in the present embodiment, as an example, rectangular) appearance in the front view. The display device 4 is formed in a flat rectangular parallelepipedal shape that is thin in the longitudinal direction. The display device 4 is, for example, a liquid crystal display (LCD), an organic electro-luminescent display (GELD), or the like. The display device 4 may also be a flexible display.

In the present embodiment, as an example, a transparent, relatively thin, quadrangular input operational panel 5 (a touch panel, touch sensor, operational face, input operational module, or input receiver) is provided on the front side (the surface side or wall 2k side) of the display device 4. The input operational panel 5 covers the display screen 4a. An operator (a user or the like) can perform input processing through operations such as touching, pressing, and rubbing the input operational panel 5 with fingers, a stylus, or the like or moving fingers, a stylus, or the like in the vicinity of the input operational panel 5. Light emitted from the display screen 4a of the display device 4 passes through the input operational panel 5 and exits from the opening 2r of the wall 2k toward the front (outside) of the casing 2. The input operational panel 5 is an example of the input module. In the present embodiment, as an example, the display device 4 and the input operational panel 5 are fixed to (supported by) the casing 2 through, for example, a joint tool (a joint component, fixing component, for example, a screw, metal tool, or component, not illustrated) or an adhesive (for example, an adhesive agent or double-side tape, not illustrated). The input operational panel 5 may be formed as an in-cell touch panel included within the display device 4.

In the present embodiment, as an example, as illustrated in FIG. 1, the casing 3 has a quadrangular (in the present embodiment, as an example, a wide rectangular) appearance in the front view and the back view. As illustrated in FIG. 1, the casing 3 is formed in a flat rectangular parallelepipedal shape that is thin in the longitudinal direction (the thickness direction of the casing 3). The casing 3 comprises the face 3a (an outer face, front side, front, front face, or face portion), a face 3b (an inner face, back side, back face, rear face, or face portion) opposite the face 3a, and a face 3p (a side face or face portion) across the face 3a and the face 3b. Both the face 3a and the face 3b cross the thickness direction. The face 3a and the face 3b are nearly parallel to each other. The faces 3a and 3b and the face 3p cross each other (in the present embodiment, as an example, they are orthogonal to each other). The casing 3 comprises, in the plan view, four ends 3c to 3f (sides, edges, or periphery portions) and four corners 3g to 3j (pointed portions, bent portions, or ends). The ends 3c and 3e are examples of long sides, whereas the ends 3d and 3f are examples of short sides.

The casing 3 comprises a wall 3k (a part, plate, front wall, face wall, top wall, or first wall), a wall 3m (a part, plate, rear wall, back wall, bottom wall, or second wall), and a wall 3n (a part, plate, side wall, end wall, upright wall, bridging portion, or third wall). The wall 3k comprises the face 3a. The wall 3m comprises the face 3b. The wall 3n comprises the face 3p. The walls 3k, 3m, and 3n are all formed in a quadrangular shape (in the present embodiment, as an example, a rectangular shape). The walls 3k, 3m, and 3n are all formed in a plate shape. The wall 3k has a quadrangular opening 3r. The casing 3 can be formed of, for example, a metallic material or a synthetic resin material, The metallic material may be formed by, for example, forging, press, or cutting. The synthetic resin material can be formed by, for example, injection molding. The casing 3 can comprise a plurality of members (components or split bodies).

In the present embodiment, as an example, one or more circuit boards 10 (a board, component, electric component, or board assembly) are held in the casing 3. The circuit board 10 is arranged parallel to the keyboard 6. The circuit board 10 is fixed to the casing 3 by a joint tool (not illustrated).

In the present embodiment, as an example, the circuit boards 10 can mount thereon a plurality of components 40 (electric components, see FIG. 2) such as a central processing unit (CPU), a graphic controller, a power supply component, a platform controller hub (PCH), a memory slot connector, an LCD connector, an input/output (I/O) connector, a power supply coil, an element, and a connector. Examples of control circuits (not illustrated) formed in the circuit board 10 can include a video signal processing circuit, a tuner, a high-definition multimedia interface (HDMI) signal processor, an audio video (AV) input terminal, a remote controller signal receiver, a controller, a selector, an on-screen display interface, a storage module (for example, a read only memory (ROM), a random access memory (RAM), a hard disk drive (HDD), a solid state drive (SSD)), and a voice signal processing circuit. The control circuit controls the output of an image (a moving image, still image, or the like) by the display screen 4a of the display device 4, the output of a voice by a speaker (not illustrated), light emission by a light-emitting diode (LED, not illustrated). The display device 4, the speaker, the LED, or the like are examples of an output part.

Figure 2:
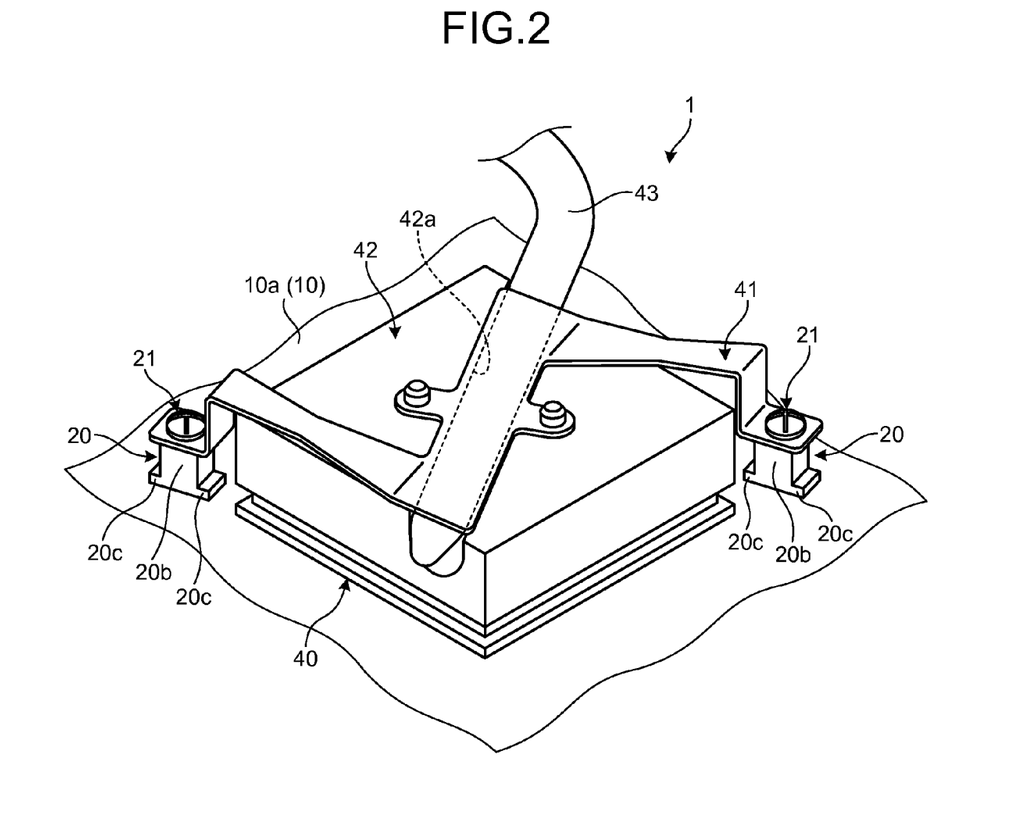
FIG. 2 is an exemplary perspective view of a configuration in which components housed in a casing of one example of the electronic device in the embodiment.

As an example, the component 40 illustrated in FIG. 2 is surface-mounted on a face 10*a* of the circuit board 10. The component 40 is pressed against the face 10*a* of the circuit board 10 by a pressing member 41 through a block 42 (a component, radiating component, radiating portion, or heat receiver). A heat pipe 43 (a component, radiating component, radiating portion, or heat receiver) is in contact with the block 42. In the present embodiment, as an example, the block 42 has a recess 42*a* (a groove), in which the heat pipe 43 is held. The pressing member 41 also has a function of pressing the heat pipe 43 against the block 42.

In the present embodiment, as an example, the pressing member 41 is fixed to a joint component 20 (a fixing component, supporting component, interposing component, base component, underlying component, or stud) through a joint tool 21 (a fixing tool or joint tool). A portion of the pressing member 41 overlapping the joint component 20 has an opening (as an example, a through hole, not illustrated). The joint component 20 has an opening 20*e* (see FIG. 3) into which the joint tool 21 (in the present embodiment, as an example, a screw) is inserted to be fixed thereto. In other words, the joint tool 21 passing through the opening of the pressing member 41 is inserted into the opening 20*e* of the joint component 20 and is fixed to the opening 20*e*, thereby fixing the pressing member 41 to the joint component 20. The joint component 20 is fixed to the circuit board 10. In other words, the joint component 20 is a component that forms a base (a base portion, base, or foundation) for mounting the pressing member 41 to the circuit board 10. FIG. 2 is merely an example of a configuration using the joint component 20, and the joint component 20, the joint tool 21, and the component 40 as an object to be joined are not limited to the configuration of FIG. 2. The component 40, the pressing member 41, the block 42, the heat pipe 43, the joint component 20, the joint tool 21, or the like are all examples of the components housed in the casing 3.

Figure 3:
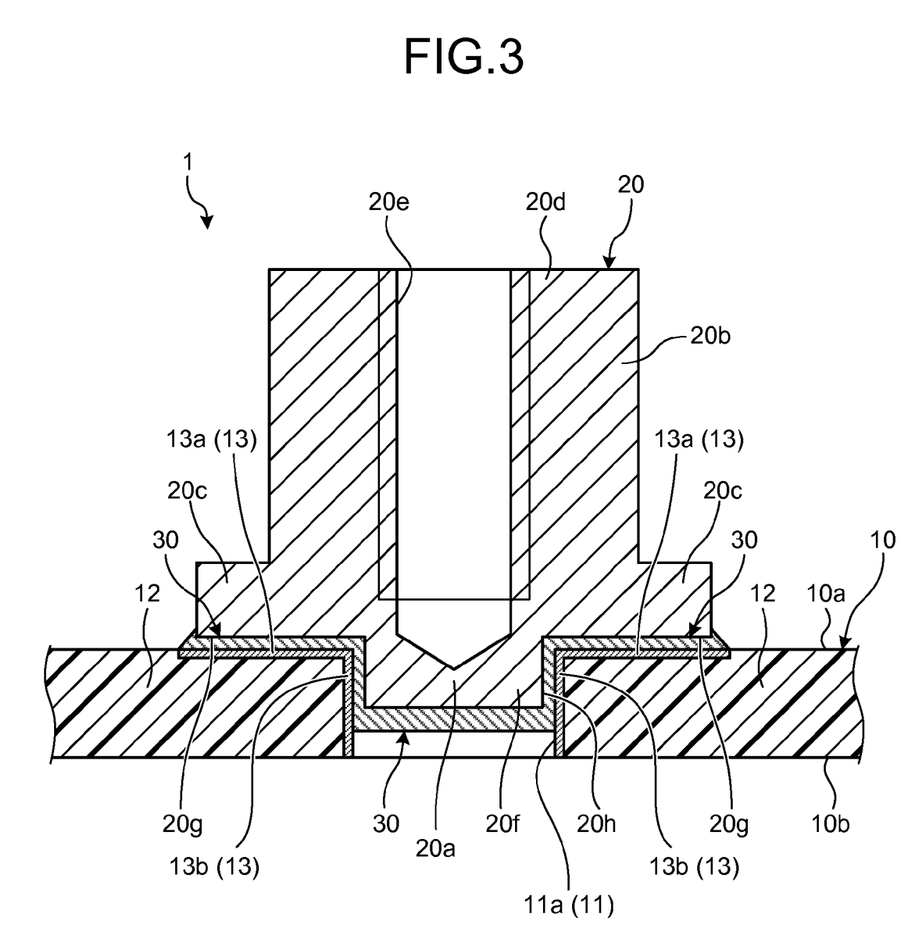
FIG. 3 is an exemplary sectional view of a circuit board and a joint component included in one example of the electronic device in the embodiment.

In the present embodiment, as an example, as illustrated in FIG. 3, the circuit board 10 comprises the face 10*a* (a first face) and a face 10*b* (a second face) opposite the face 10*a*. The circuit board 10 is, as an example, a plate-shaped, rigid board. The circuit board 10 has an opening 11 (a first opening). In the present embodiment, as an example, the opening 11 is formed as a cylindrical through hole. In other words, the opening 11 communicates with the face 10*b* as well as the face 10*a*. The circuit board 10 comprises an insulator 12 and a conductor 13. The insulator 12, as an example, can be formed of a synthetic resin material having insulating property such as glass epoxy resin. The conductor 13, as an example, can be formed of a metallic material having relatively high conductivity such as a copper-based material by etching, plating treatment, or the like. The conductor 13 comprises a flat part 13*a* provided along the face 10*a* and a cylindrical part 13*b* provided along the inner periphery of the opening 11.

In the present embodiment, as an example, as illustrated in FIGS. 2 and 3, the joint component 20 comprises an insertion portion 20*a*, a protruding portion 20*b*, and an flared portion 20*c*. The insertion portion 20*a* (a protruding portion or first part) is inserted into the opening 11. The insertion portion 20*a* is, in the present embodiment, as an example, formed in a cylindrical columnar shape. The protruding portion 20*b* (a second part) is positioned on a side opposite the face 10*b* with respect to the face 10*a* of the circuit board 10. The protruding portion 20*b* is integral with the insertion portion 20*a* and extends from the insertion portion 20*a* toward a side opposite the face 10*b* in a direction crossing the face 10*a* (in the present embodiment, as an example, a direction orthogonal to the face 10*a*). The protruding portion 20*b* is formed in a polygonal prismatic shape (in the present embodiment, as an example, a quadratic prismatic shape). The flared portion 20*c* (a third part, portion of the second part, flange, pedestal, or support) flares out (protrudes) from the basal part of the protruding portion 20*b* along the face 10*a*. In the present embodiment, as an example, the two flared portions 20*c* extend in a contrary direction (a departing direction or opposite direction) and are formed in a quadrangular and plate shape. The protruding portion 20*b* has an opening 20*e* (a second opening) provided on an end 20*d* (a first end) on the end away from the face 10*a* (opposite the face 10*b*). The opening 20*e* is formed as a female screw hole (a female screw portion) to which the joint tool 21 is joined. In the present embodiment, the opening 20*e* does not communicate with an end 20*f* (a second end) opposite the end 20*d*. In other words, the opening 20*e* is an example of a recess that is provided to (communicates with) the end 20*d*. The joint component 20 can be formed of, as an example, an iron-based material such as stainless steel.

In the present embodiment, as an example, as illustrated in FIG. 3, the joint component 20 is bonded to the circuit board 10 through a bonding agent 30. The bonding agent 30 bonds the circuit board 10 and the joint component 20 together electrically and mechanically. The bonding agent 30 is, as an example, solder or a conductive adhesive agent. Specifically, the bonding agent 30 is provided between the face 10*a* (a conductor 13) of the circuit board 10 and the protruding portion 20*b* or a face 20*g* of the flared portion 20*c*. The bonding agent 30 is also provided between a face 11*a* (an inner face or periphery) of the opening 11 of the circuit board 10 and a face 20*h* (an outer face or periphery) of the insertion portion 20*a*. In other words, the diameter (the inner diameter) of the opening 11 is set to be larger than the diameter (the inner diameter) of the insertion portion 20*a* by an area (a gap) the bonding agent 30 enters. In other words, in the present embodiment, as an example, the insertion portion 20*a* is not press-fit into the opening 11, and a gap with an appropriate size that allows the bonding agent 30 to interpose is set between the face 11*a* and the face 20*h*. The face 11*a* and the face 20*h* are formed coaxially and in a similar shape. During assembly, with the bonding agent 30 coated on the face 10*a* by printing processing or the like to be liquid and softened, the insertion portion 20*a* is inserted into the opening 11. Consequently, the deviation of the insertion portion 20*a* within the opening 11 may be suppressed. In the present embodiment, as an example, the bonding agent 30 is also positioned on the end 20*f* side of the insertion portion 20*a*.

In the present embodiment, as an example, the length of the insertion portion 20*a* is shorter than the thickness of the circuit board 10 (the length of the opening 11), thereby allowing the insertion portion 20*a* to be inserted into the opening 11 halfway. In the present embodiment, as an example, the bonding agent 30 positioned along the end 20*f* of the insertion portion 20*a* is positioned at a side closer to the face 10*a* than to the face 10*b*. In other words, in the present embodiment, as an example, the bonding agent 30 positioned along the insertion portion 20*a* is prevented from leaking on the face 10*b* side.

As described above, in the present embodiment, as an example, (the insertion portion 20*a* of) the joint component 20 does not pass through the opening 11 of the circuit board 10. Consequently, the present embodiment, as an example, allows the configuration in which the joint component 20 is fixed to the circuit board 10 to be likely to be smaller as compared to a configuration in which the joint component 20 passes through the circuit board 10. The present embodiment is, as an example, likely to reduce a number of components as compared to a configuration in which a nut is mounted to a portion of the joint component 20 passing through the opening 11 of the circuit board 10 and protruding through the face 10b and may even reduce time and effort on manufacture.

In the present embodiment, as an example, the insertion portion 20a of the joint component 20 is inserted into the opening 11 of the circuit board 10. The bonding agent 30 is provided between the insertion portion 20a and the opening 11 and between the protruding portion 20b or the flared portion 20c and the face 10a (the conductor 13). Consequently, the present embodiment, as an example, allows the joint component 20 to be fixed to the circuit board 10 more easily and more tightly.

In the present embodiment, as an example, as illustrated in FIG. 3, a portion (the interior or bottom) of the opening 20e is positioned in the insertion portion 20a (reaches the insertion portion 20a). Consequently, as an example, the opening 20e is likely to be formed longer (deeper). Consequently, as an example, the height of the protruding portion 20b is likely to be set to be shorter.

In the present embodiment, as an example, the joint component 20 comprises the flared portion 20c, and the flared portion 20c and the face 10a (the conductive part 13) are bonded together through the bonding agent 30. Consequently, the present embodiment, as an example, allows the joint component 20 to be fixed to the circuit board 10 more tightly as compared to a case in which the flared portion 20c is missing.

In the present embodiment, as an example, the bonding agent 30 is, within the opening 11, positioned at a side closer to the face 10a than to the face 10b. Consequently, the present embodiment is likely to suppress inconvenience that the bonding agent 30 leaks from the opening 11 on the face 10b of the circuit board 10, thereby, as an example, increasing the thickness of the assembly of the circuit board 10 and the component.

In the present embodiment, as an example, the opening 20e does not communicate with the end 20f. Consequently, the present embodiment, as an example, suppresses the occurrence of inconvenience that the bonding agent 30 enters the opening 20e, thereby, as an example, making the joint tool 21 hard to be joined.

First Modification

Figure 4:
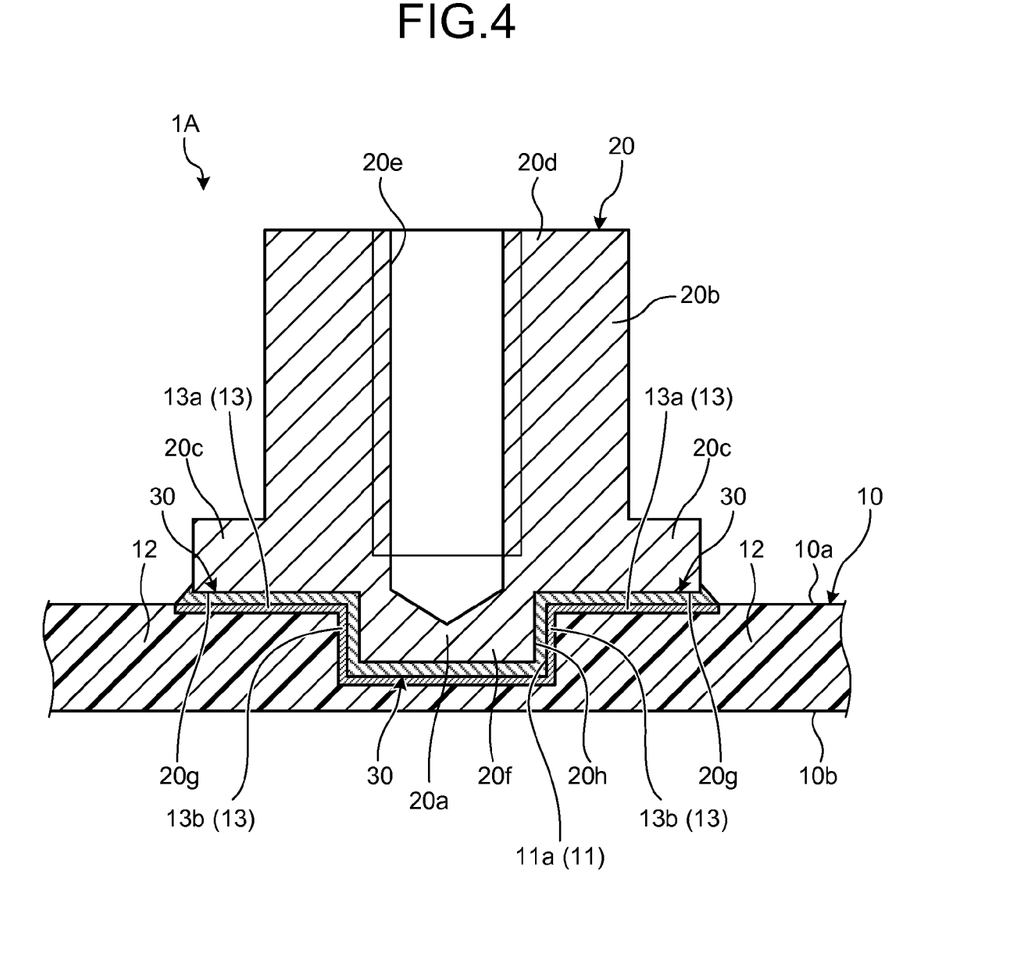
FIG. 4 is an exemplary sectional view of a circuit board and a joint component included in one example of an electronic device according to a first modification of the embodiment.

An electronic device 1A according to a modification illustrated in FIG. 4 comprises a similar configuration as the electronic device 1 according to the above embodiment. Consequently, the present modification can also provide similar effects based on the similar constitution. The parts (configuration) illustrated in FIG. 4 can be replaced with the parts (configuration) illustrated in FIG. 3 of the above first embodiment.

However, in the present modification, as an example, as illustrated in FIG. 4, the opening 11 does not pass through the circuit board 10. In other words, the opening 11 does not communicate with the face 10b. Consequently, the present modification, as an example, is likely to suppress inconvenience that the bonding agent 30 leaks from the opening 11 on the face 10b of the circuit board 10, thereby, as an example, increasing the thickness of the assembly of the circuit board 10 and the component.

Second Modification

Figure 5:
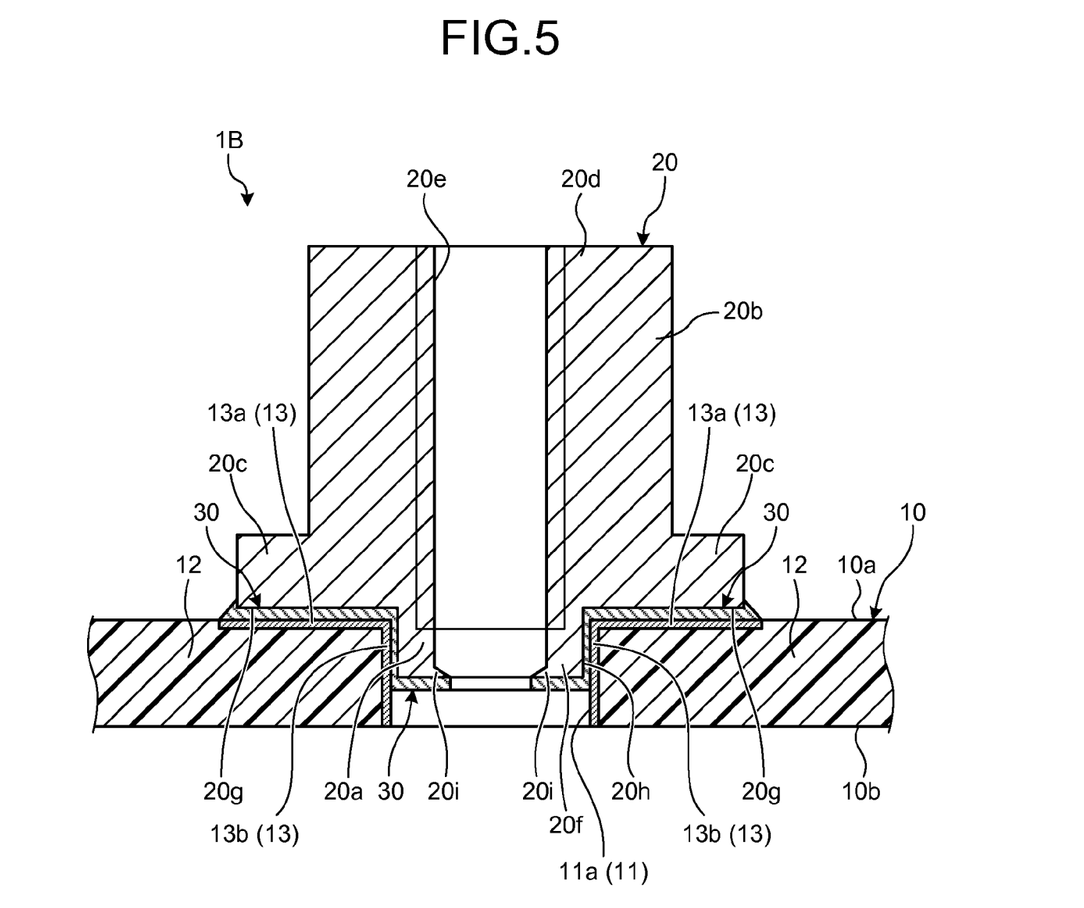
FIG. 5 is an exemplary sectional view of a circuit board and a joint component included in one example of an electronic device according to a second modification of the embodiment.

An electronic device 1B according to a modification illustrated in FIG. 5 comprises a similar configuration as the electronic devices 1 and 1A according to the above embodiment and modification. Consequently, the present modification can also provide similar effects based on the similar configuration. The parts (configuration) illustrated in FIG. 5 can be replaced with the parts (configuration) illustrated in FIG. 3 of the above first embodiment.

However, in the present modification, as an example, as illustrated in FIG. 5, the opening 20e passes through the joint component 20, and the opening 20e communicates with the end 20f. Consequently, the present modification, as an example, allows the opening 20e to be likely to be formed longer (deeper). Consequently, as an example, the height of the protruding portion 20b is likely to be set to be much shorter.

Furthermore, in the present embodiment, as an example, as illustrated in FIG. 5, the joint component 20 comprises a suppressing portion 20i that prevents the bonding agent 30 from moving toward the end 20d in the opening 20e. Specifically, on the end 20f of the opening 20e, the suppressing portion 20i protrudes from the peripheral side toward the central side of the opening 20e across the entire perimeter of the peripheral part of the opening 20e. The suppressing portion 20i is formed so that it becomes thinner from the periphery portion toward the central portion of the opening 20e in accordance with the tip shape of a drill that machines the opening 20e. Consequently, the present modification, as an example, is likely to obtain the suppressing portion 20i as a relatively simple constitution.

Third Modification

Figure 6:
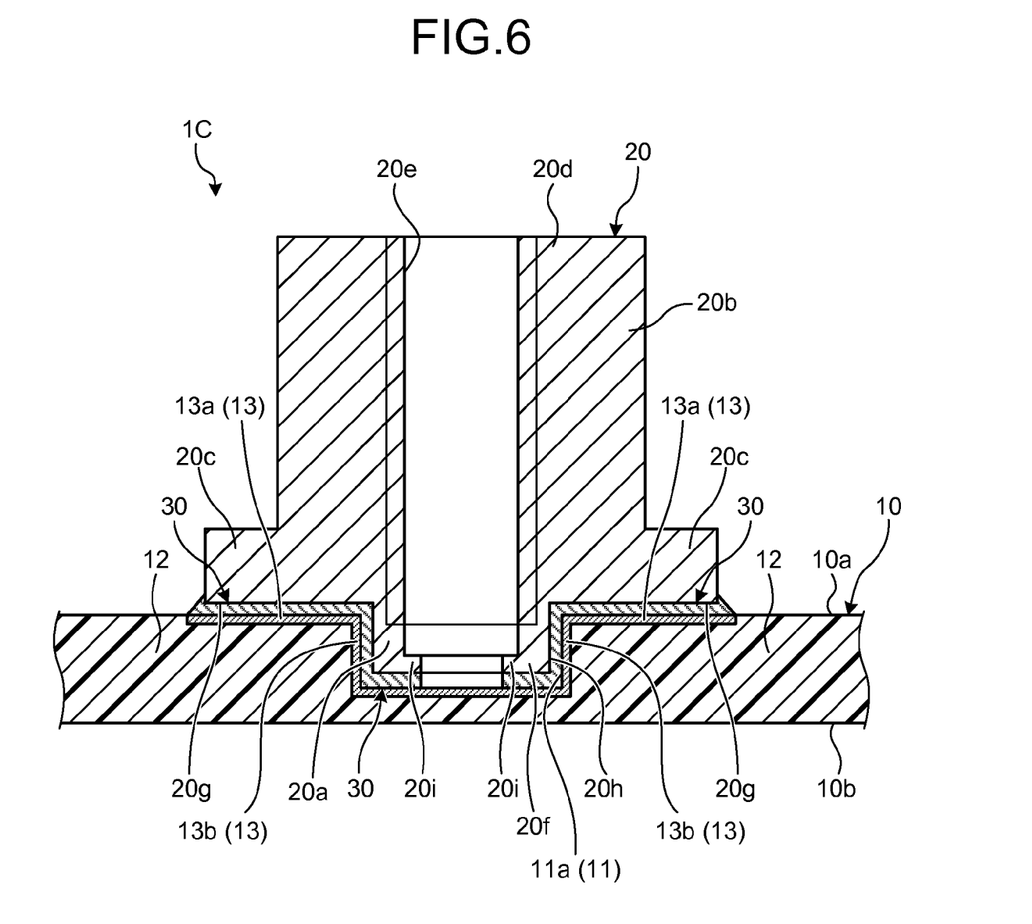
FIG. 6 is an exemplary sectional view of a circuit board and a joint component included in one example of an electronic device according to a third modification of the embodiment.

An electronic device 1C according to a modification illustrated in FIG. 6 comprises a similar configuration as the electronic devices 1, 1A, and 1B according to the above embodiment and modifications. Specifically, in the present embodiment, as an example, as illustrated in FIG. 6, the opening 11 does not communicate with the face 10b. In the present embodiment, as an example, the joint component 20 comprises the suppressing portion 20i having, unlike the second modification, the same thickness from the periphery portion to the central portion of the opening 20e on the end 20f of the opening 20e. The present modification can also provide similar effects based on the similar configuration to the above embodiment and modifications. The parts (configuration) illustrated in FIG. 6 can be replaced with the parts (configuration) illustrated in FIG. 3 of the above first embodiment.

Fourth Modification

Figure 7:
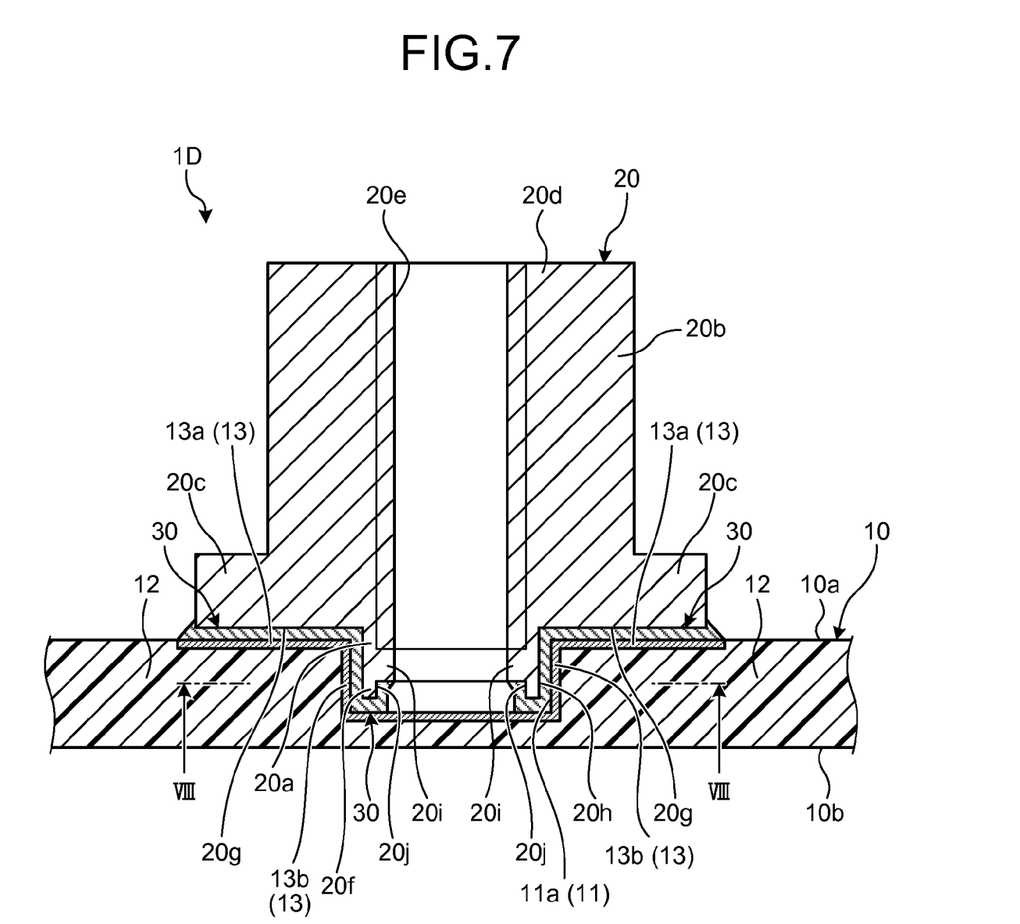
FIG. 7 is an exemplary sectional view of a circuit board and a joint component included in one example of an electronic device according to a fourth modification of the embodiment.
Figure 8:
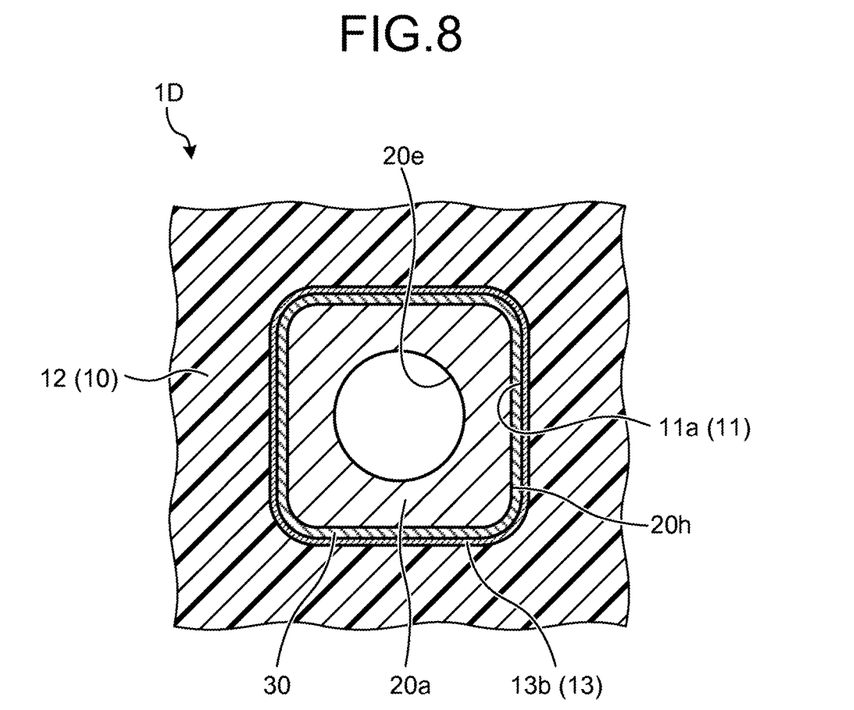
FIG. 8 is an exemplary sectional view of one example of the circuit board and the joint component, taken along line VIII-VIII of FIG. 7, in the fourth modification.

An electronic device 1D according to a modification illustrated in FIGS. 7 and 8 comprises a similar configuration as the electronic devices 1 and 1A to 1C according to the above embodiment and modifications. Consequently, the present modification can also provide similar effects based on the similar constitution. The parts (configuration) illustrated in FIG. 7 can be replaced with the parts (configuration) illustrated in FIG. 3 of the above first embodiment.

However, in the present modification, as an example, the suppressing portion 20i formed in a step shape on the end 20f of the opening 20e. In the present modification, as an example, the suppressing portion 20i is an example of a step portion. The suppressing portion 20i is provided on a side of the face 10b (on a side of the end 20f) of the opening 20e. A cylindrical recess 20j having a larger diameter than that of the opening 20e is provided. Therefore, the suppressing portion 20i is formed as a boundary portion between the cylindrical recess 20j and a cylindrical part that is on the inner side of the recess 20j. Consequently, the present modification, as an example, is also likely to obtain the suppressing portion 20i as a relatively simple configuration.

In the present modification, as an example, the gap between the insertion portion 20a and the opening 11 is formed in a polygonal (in the present modification, as an example, a quadrangular) and tubular shape. In other words, the face 20h of the insertion portion 20a is formed in a polygonal and columnar shaped surface (an outer surface), the face 11a of the opening 11 is formed in a polygonal and tubular shaped surface (an inner surface), and a gap having nearly a constant height (size) is formed between the face 20h and the face 11a. In other words, the size of the opening 11 is set to be larger than the size of the insertion portion 20a by a gap (area) the bonding agent 30 enters. In other words, in the present embodiment, as an example, the insertion portion 20a is not press-fit into the opening 11, and a gap with an appropriate size that allows the bonding agent 30 to be present is set between the face 11a and the face 20h. The face 11a and the face 20h are formed coaxially and in a similar shape. In the present embodiment, as an example, the deviation of the attitude of the joint component 20 with respect to the circuit board 10 is likely to be suppressed. As an example, the volume of the gap is likely to increase as compared to a case in which the face 20h of the insertion portion 20a is formed in a circular columnar surface (an outer surface), and the face 11a of the opening 11 is formed in a circular cylindrical surface (an inner surface). Consequently, as an example, the bonding force (the bonding strength) by the bonding agent 30 is likely to increase.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
    a casing;
    a circuit board housed within the casing, the circuit board comprises a first face and a second face opposite the first face, and further comprises a first opening provided on the first face;
    a joint component comprising:
        an insertion portion configured to be inserted into the first opening;
        a protruding portion configured to protrude from the insertion portion toward a side opposite the second face;
        a first end of the protruding portion provided at a side opposite the second face; and
        a flange extended along the first face, wherein
    the joint component comprises a second opening provided on the first end, extended to the insertion portion, and into which a joint tool is inserted; and
    a bonding agent provided between the insertion portion and the first opening and between the flange and the first face, and configured to bond the circuit board and the joint component with each other, wherein
    the joint component comprises a second end opposite the first end,
    the second opening is configured to communicate with the second end, and
    the insertion portion comprises a suppressing portion configured to prevent the bonding agent from moving toward the first end in the second opening.

2. The electronic device of claim 1, wherein the first opening is configured not to communicate with the second face.

3. The electronic device of claim 1, wherein
    the first opening is configured to communicates with the second face, and
    the bonding agent is positioned, within the first opening, closer to the first face than to the second face.

4. The electronic device of claim 1, wherein the suppressing portion is configured to protrude from the peripheral side toward the central side of the second opening.

5. The electronic device of claim 1, wherein the suppressing portion is formed in a step shape.

6. The electronic device of claim 1, wherein
    a gap is formed between the insertion portion and the first opening,
    the gap extends in a direction crossing the first face,
    the gap has a polygonal shape in cross section, and
    the bonding agent is provided in the gap.

* * * * *